(12) United States Patent
Kim et al.

(10) Patent No.: US 11,718,750 B2
(45) Date of Patent: Aug. 8, 2023

(54) THERMOPLASTIC RESIN COMPOSITION FOR LASER DIRECT STRUCTURING PROCESS, AND MOLDED PRODUCT COMPRISING SAME

(71) Applicant: LOTTE CHEMICAL CORPORATION, Seoul (KR)

(72) Inventors: Nam Hyun Kim, Uiwang-si (KR); Jung Ki Kim, Uiwang-si (KR); Sang Hyun Hong, Uiwang-si (KR)

(73) Assignee: Lotte Chemical Corporation, Seoul (KR)

( * ) Notice: Subject to any disclaimer, the term of this patent is extended or adjusted under 35 U.S.C. 154(b) by 204 days.

(21) Appl. No.: 16/958,860

(22) PCT Filed: Dec. 5, 2018

(86) PCT No.: PCT/KR2018/015345
§ 371 (c)(1),
(2) Date: Jun. 29, 2020

(87) PCT Pub. No.: WO2019/132292
PCT Pub. Date: Jul. 4, 2019

(65) Prior Publication Data
US 2021/0070984 A1    Mar. 11, 2021

(30) Foreign Application Priority Data

Dec. 31, 2017  (KR) ........................ 10-2017-0185036

(51) Int. Cl.
| | |
|---|---|
| *C08L 69/00* | (2006.01) |
| *C08L 67/02* | (2006.01) |
| *C08K 3/32* | (2006.01) |
| *C23C 18/28* | (2006.01) |
| *C08G 63/183* | (2006.01) |
| *C08G 77/448* | (2006.01) |
| *C08L 51/04* | (2006.01) |
| *C08L 83/04* | (2006.01) |
| *C23C 18/16* | (2006.01) |
| *H05K 1/03* | (2006.01) |
| *C23C 18/20* | (2006.01) |
| *C08G 64/18* | (2006.01) |

(52) U.S. Cl.
CPC ............ *C08L 69/00* (2013.01); *C08G 63/183* (2013.01); *C08G 77/448* (2013.01); *C08K 3/32* (2013.01); *C08L 51/04* (2013.01); *C08L 67/02* (2013.01); *C08L 83/04* (2013.01); *C23C 18/1612* (2013.01); *C23C 18/204* (2013.01); *H05K 1/0373* (2013.01); *C08G 64/186* (2013.01); *C08K 2003/321* (2013.01); *C08K 2003/328* (2013.01); *C08L 2207/53* (2013.01)

(58) Field of Classification Search
None
See application file for complete search history.

(56) References Cited

U.S. PATENT DOCUMENTS

| | | |
|---|---|---|
| 6,969,745 B1 | 11/2005 | Taraiya et al. |
| 2004/0059068 A1 | 3/2004 | Nodera |
| 2012/0128984 A1* | 5/2012 | Kawabata ............. C08L 67/025 525/437 |
| 2014/0194561 A1 | 7/2014 | Ganguly et al. |
| 2014/0206800 A1* | 7/2014 | Wu ......................... C08K 3/34 524/508 |
| 2014/0296410 A1 | 10/2014 | Cheng et al. |
| 2014/0296411 A1 | 10/2014 | Cheng et al. |
| 2014/0353543 A1 | 12/2014 | Wu et al. |
| 2016/0168377 A1 | 6/2016 | Jang et al. |
| 2017/0022358 A1* | 1/2017 | Schrauwen .............. C08J 7/123 |
| 2018/0171137 A1 | 6/2018 | Woo et al. |
| 2018/0251635 A1* | 9/2018 | Sohn .......................... C08J 5/00 |
| 2018/0362758 A1 | 12/2018 | Wu et al. |

FOREIGN PATENT DOCUMENTS

| | | | |
|---|---|---|---|
| KR | 10-2007-0037718 A | | 4/2007 |
| KR | 2015037379 | * | 4/2015 |
| KR | 2016-0016957 A | | 2/2016 |
| KR | 10-2016-0073449 A | | 6/2016 |
| KR | 10-2016-0129961 A | | 11/2016 |
| KR | 10-2016-0129974 A | | 11/2016 |
| KR | 10-2017-0092143 A | | 8/2017 |
| WO | 2014/162255 A1 | | 10/2014 |
| WO | WO2017/015434 | * | 1/2017 |
| WO | WO2017/034376 | * | 3/2017 |
| WO | 2017/109591 A1 | | 6/2017 |
| WO | 2019/132292 A1 | | 7/2019 |

OTHER PUBLICATIONS

International Search Report in counterpart International Application No. PCT/KR2018/015345 dated Mar. 15, 2019, pp. 1-6.
Extended Search Report in counterpart European Application No. 18895076.0 dated Aug. 19, 2021, pp. 1-6.

* cited by examiner

*Primary Examiner* — David J Buttner
(74) *Attorney, Agent, or Firm* — Additon, Pendleton & Witherspoon, P.A.

(57) ABSTRACT

The present invention relates to a thermoplastic resin composition for laser direct structuring process, and a molded product comprising the same. In one specific embodiment, the thermoplastic resin composition comprises: approximately 100 parts by weight of a base resin; approximately 0.1-20 parts by weight of an additive for laser direct structuring; and approximately 1-20 parts by weight of an impact modifier, wherein the base resin comprises a polycarbonate resin, a polycarbonate-polysiloxane copolymer and a polyester resin.

8 Claims, 1 Drawing Sheet

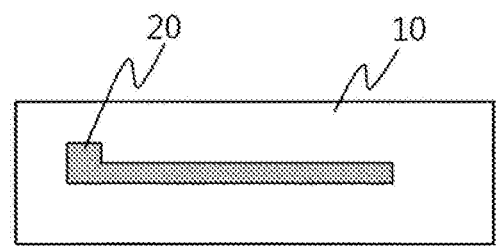

THERMOPLASTIC RESIN COMPOSITION FOR LASER DIRECT STRUCTURING PROCESS, AND MOLDED PRODUCT COMPRISING SAME

CROSS-REFERENCE TO RELATED APPLICATIONS

This application claims priority to and the benefit of International Application No. PCT/KR2018/015345, filed Dec. 5, 2018, which published as WO 2019/132292 on Jul. 4, 2019, and Korean Patent Application No. 10-2017-0185036, filed in the Korean Intellectual Property Office on Dec. 31, 2017, the entire disclosure of each of which is incorporated herein by reference.

TECHNICAL FIELD

The present invention relates to a thermoplastic resin composition for laser direct structuring and a molded product comprising the same.

BACKGROUND ART

A laser direct structuring (LDS) process may be used to form a metal layer on at least a portion of a surface of a molded product produced from a thermoplastic resin composition. The LDS process is a pretreatment method to modify a plating target region to have suitable properties for plating by irradiating the surface of the molded product with laser beams. To this end, a thermoplastic resin composition is required to contain an additive for laser direct structuring (LDS additive), which can form metal nuclei upon irradiation with laser beams. The LDS additive is decomposed to generate metal nuclei upon irradiation with the laser beams. In addition, a region irradiated with laser beams has a roughened surface. Due to such metal nuclei and surface roughness, the laser-modified region becomes suitable for plating.

The LDS process allows rapid and economic formation of electronic/electric circuits on a three-dimensional molded product. For example, the LDS process may be advantageously used in manufacture of antennas for portable electronic devices, radio frequency identification (RFID) antennas, and the like.

On the other hand, antennas for mobile electronic devices, such as smart phones and the like, require separate electrodes corresponding to frequency bands and it is important to realize fine patterns corresponding to the frequency bands. The LDS process can realize fine patterns at a desired location, thereby securing a high degree of freedom in design.

A typical LDS additive decomposes a thermoplastic resin composition at a processing temperature of the thermoplastic resin composition, thereby causing discoloration, gas generation, carbonization and the like through deterioration in thermal stability. Therefore, there is a need for development of a thermoplastic resin composition for laser direct structuring which has good properties in terms of durability, plating reliability and thermal stability under high temperature/humidity conditions, and can suppress gas generation upon injection molding, and a molded product including the same.

The background technique of the present invention is disclosed in Korean Patent Laid-open Publication No. 2016-0016957.

DISCLOSURE

Technical Problem

It is one aspect of the present invention to provide a thermoplastic resin composition for laser direct structuring which has good plating reliability under high temperature/humidity conditions.

It is another aspect of the present invention to provide a thermoplastic resin composition for laser direct structuring which has good impact resistance and heat resistance.

It is a further aspect of the present invention to provide a molded product formed of the thermoplastic resin composition for laser direct structuring.

Technical Solution

1. One aspect of the present invention relates to a thermoplastic resin composition for laser direct structuring. In one embodiment, the thermoplastic resin composition may comprise: 100 parts by weight of a base resin comprising about 20% by weight (wt %) to about 70 wt % of a polycarbonate resin; about 10 wt % to about 70 wt % of a polycarbonate-polysiloxane copolymer, and about 5 wt % to about 30 wt % of a polyester resin containing an alicyclic group in a main chain; about 0.1 to about 20 parts by weight of an additive for laser direct structuring; and about 1 to about 20 parts by weight of an impact modifier.

2. In Embodiment 1, the polyester resin may comprise poly(1,4-cyclohexylene dimethylene terephthalate) (PCT).

3. In Embodiments 1 and 2, the polycarbonate-polysiloxane copolymer may comprise about 80 wt % to about 95 wt % of a polycarbonate block and about 5 wt % to about 20 wt % of a polysiloxane block.

4. In Embodiments 1 to 3, the polycarbonate-polysiloxane copolymer may have a weight average molecular weight of about 10,000 g/mol to about 50,000 g/mol.

5. In Embodiments 1 to 4, the additive for laser direct structuring may comprise at least one selected from the group of a heavy metal oxide complex spinel and a copper salt.

6. In Embodiments 1 to 5, the impact modifier may comprise an impact modifier of a core-shell structure obtained by grafting an unsaturated compound comprising at least one selected from the group of an acrylic monomer, an aromatic vinyl monomer, an unsaturated nitrile monomer and polymers thereof to a rubber polymer obtained through polymerization of a diene monomer or a rubber polymer obtained through copolymerization of at least one monomer selected from the group of a diene monomer, an acrylic monomer, a silicone monomer, and a styrene monomer.

7. In Embodiments 1 to 6, the impact modifier and the polycarbonate-polysiloxane copolymer may be present in a weight ratio of about 1:5 to about 1:10.

8. In Embodiments 1 to 7, the additive for laser direct structuring and the impact modifier may be present in a weight ratio of about 1:1 to about 1:3.

9. In Embodiments 1 to 8, the thermoplastic resin composition may have a weight-dropping height of about 60 cm or more, at which cracks are generated on a specimen of the thermoplastic resin composition upon dropping a metal tip having a weight of 500 g on the specimen in accordance with the DuPont drop test method, in which the specimen is prepared by dipping an injection molded specimen having a size of 100 mm×100 mm×3.2 mm in a thinner solution (T-280, Noroo Paint®) for 2 minutes, drying the specimen at 80° C. for 20 minutes, and leaving the specimen at room temperature for 24 hours.

10. Another aspect of the present invention relates to a molded product formed of the thermoplastic resin compositions of Embodiments 1 to 9.

11. In Embodiment 10, the molded product may include a metal layer formed on at least part of a surface thereof by laser direct structuring and plating.

Advantageous Effects

A molded product produced using the thermoplastic resin composition according to the present invention has good plating reliability under high temperature/humidity conditions, good impact resistance after plating, and good heat resistance.

DRAWINGS

FIG. 1 is a view of a molded product according to one embodiment of the present invention.

BEST MODE

Hereinafter, embodiments of the present invention will be described in detail with reference to the accompanying drawings. Description of known functions and constructions which can unnecessarily obscure the subject matter of the present invention will be omitted herein.

The terms used herein are defined by taking functions of the present invention into account and can be changed according to user or operator's custom or intention. Therefore, definition of the terms should be made according to the overall disclosure set forth herein.

Thermoplastic Resin Composition for Laser Direct Structuring

One aspect of the present invention relates to a thermoplastic resin composition for laser direct structuring. In one embodiment, the thermoplastic resin composition includes a base resin; an LDS additive; and an impact modifier.

Base Resin

The base resin comprises a polycarbonate resin, a polycarbonate-polysiloxane copolymer, and a polyester resin containing an alicyclic group in a main chain.

Polycarbonate Resin

According to the present invention, the polycarbonate resin may be selected from any polycarbonate resins used in a typical thermoplastic resin composition. For example, the polycarbonate resin may be an aromatic polycarbonate resin prepared by reacting diphenols (aromatic diol compounds) with a precursor, such as phosgene, halogen formate, or carbonate diester:

[Formula 1]

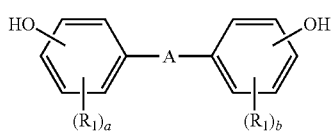

wherein A is a single bond, a substituted or unsubstituted $C_1$ to $C_{30}$ linear or branched alkylene group, a substituted or unsubstituted $C_2$ to $C_5$ alkenylene, a substituted or unsubstituted $C_2$ to $C_5$ alkylidene, a substituted or unsubstituted $C_1$ to $C_{30}$ linear or branched halo-alkylene group, a substituted or unsubstituted $C_5$ to $C_6$ cycloalkylene group, a substituted or unsubstituted $C_5$ to $C_6$ cycloalkenylene, a substituted or unsubstituted $C_5$ to $C_{10}$ cycloalkylidene, a substituted or unsubstituted $C_6$ to $C_{30}$ arylene group, a substituted or unsubstituted $C_1$ to $C_{20}$ linear or branched alkoxylene group, an ester group of halogenic acid, a carbonic ester group, CO, S, or $SO_2$; $R_1$ and $R_2$ are identical to or different from each other and are a substituted or unsubstituted $C_1$ to $C_{30}$ alkyl group, or a substituted or unsubstituted $C_6$ to $C_{30}$ aryl group; and a and b are each independently an integer from 0 to 4.

Examples of the diphenols represented by Formula 1 may include 4,4'-biphenol, 2,2-bis(4-hydroxyphenyl)propane, 2,4-bis(4-hydroxyphenyl)-2-methylbutane, 1,1-bis(4-hydroxyphenyl)cyclohexane, 2,2-bis(3-methyl-4-hydroxyphenyl)propane, 2,2-bis(3,5-dimethyl-4-hydroxyphenyl)propane, 2,2-bis(3-chloro-4-hydroxyphenyl)propane, and 2,2-bis(3,5-dichloro-4-hydroxyphenyl)propane, without being limited thereto. For example, the diphenols may be 2,2-bis(4-hydroxyphenyl)propane, 2,2-bis(3-methyl-4-hydroxyphenyl)propane, 2,2-bis(3,5-dimethyl-4-hydroxyphenyl)propane, 2,2-bis(3,5-dichloro-4-hydroxyphenyl)propane, or 1,1-bis(4-hydroxyphenyl)cyclohexane, specifically 2,2-bis-(4-hydroxyphenyl)propane, which is also referred to as bisphenol A.

The polycarbonate resin may be a mixture of a copolymer obtained from two or more diphenols. For example, the polycarbonate resin may include a linear polycarbonate resin. The linear polycarbonate resin may be a bisphenol-A polycarbonate resin.

In some embodiments, the polycarbonate resin may be a branched polycarbonate resin. For example, the polycarbonate resin may be a branched polycarbonate resin obtained by adding about 0.05 mol % to about 2 mol % of a tri- or higher polyfunctional compound, specifically, a tri- or higher valent phenol group-containing compound based on the total number of moles of the diphenols used in polymerization.

The polycarbonate resin may be a homopolycarbonate resin, a copolycarbonate resin, or a blend thereof.

The polycarbonate resin may be partially or completely replaced by an aromatic polyester-carbonate resin obtained by polymerization in the presence of an ester precursor, for example, a bifunctional carboxylic acid.

The polycarbonate resin may have a weight average molecular weight (Mw) of about 10,000 g/mol to about 200,000 g/mol, as measured by gel permeation chromatography (GPC). For example, the polycarbonate resin may have a weight average molecular weight (Mw) of about 15,000 g/mol to about 80,000 g/mol, without being limited thereto.

In one embodiment, the polycarbonate resin may be present in an amount of about 20 wt % to about 70 wt % based on 100 wt % of the base resin. If the content of the polycarbonate resin is less than about 20 wt %, the thermoplastic resin composition can suffer from deterioration in processability and external appearance, and if the content of the polycarbonate resin exceeds about 70 wt %, the thermoplastic resin composition can suffer from deterioration in plating reliability and impact resistance. For example, the polycarbonate resin may be present in an amount of about 30 wt % to about 65 wt %.

Polycarbonate-Polysiloxane Copolymer

The polycarbonate-polysiloxane copolymer comprises a polycarbonate block and a polysiloxane block.

In one embodiment, the polycarbonate block may comprise a structural unit derived from the polycarbonate resin and the polysiloxane block may comprise a structural unit derived from Formula 2:

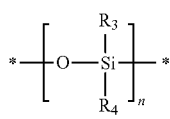

[Formula 2]

wherein $R_3$ and $R_4$ are identical to or different from each other and are a hydrogen atom, a substituted or unsubstituted $C_1$ to $C_{20}$ alkyl group, a substituted or unsubstituted $C_2$ to $C_{20}$ alkenyl group, a substituted or unsubstituted $C_2$ to $C_{20}$ alkynyl group, a substituted or unsubstituted $C_1$ to $C_{20}$ alkoxy group, a substituted or unsubstituted $C_3$ to $C_{30}$ cycloalkyl group, a substituted or unsubstituted $C_3$ to $C_{30}$ cycloalkenyl group, a substituted or unsubstituted $C_3$ to $C_{30}$ cycloalkynyl group, a substituted or unsubstituted $C_6$ to $C_{30}$ aryl group, a substituted or unsubstituted $C_6$ to $C_{30}$ aryloxy group, a substituted or unsubstituted $C_6$ to $C_{30}$ aryl group, or NRR' (R and R' being identical to or different from each other and being a hydrogen atom or a substituted or unsubstituted $C_1$ to Czo alkyl group), and * is a linking site.

In Formula 2, n ranges from 2 to 10,000, for example, 2 to 1,000. Within this range, the thermoplastic resin composition exhibits good impact resistance and suitable viscosity to allow efficient extrusion. For example, n ranges from 10 to 100, specifically from 25 to 80.

In one embodiment, the polycarbonate-polysiloxane copolymer may comprise about 80 to about 95 wt % of the polycarbonate block and about 5 to about 20 wt % of the polysiloxane block. Within these ranges, the thermoplastic resin composition can have good heat resistance and impact resistance.

In one embodiment, the polycarbonate-polysiloxane copolymer may have a weight average molecular weight (Mw) of about 10,000 g/mol to about 50,000 g/mol. For example, the polycarbonate-polysiloxane copolymer may have a weight average molecular weight (Mw) of about 15,000 g/mol to about 40,000 g/mol. Within this range, the thermoplastic resin composition can have good impact resistance.

In one embodiment, the polycarbonate-polysiloxane copolymer may have a melt flow index (MI) of about 3 g/10 min to about 100 g/10 min, as measured under conditions of 300° C. and 1.2 kgf in accordance with ASTM D1238. Within this range, the thermoplastic resin composition can have good mechanical properties and flowability. For example, the polycarbonate-polysiloxane copolymer may have a melt flow index (MI) of about 10 g/10 min to about 70 g/10 min.

The polycarbonate-polysiloxane copolymer may be present in an amount of about 10 wt % to about 70 wt % based on 100 wt % of the base resin. If the content of the polycarbonate-polysiloxane copolymer is less than about 10 wt %, the thermoplastic resin composition can suffer from deterioration in plating reliability under high temperature/ humidity conditions and impact resistance after painting, and if the content of the polycarbonate-polysiloxane copolymer exceeds about 70 wt %, the thermoplastic resin composition can suffer from deterioration in impact resistance, heat resistance, and processability. For example, the polycarbonate-polysiloxane copolymer may be present in an amount of about 20 wt % to about 60 wt %.

Polyester Resin

The polyester resin may contain an alicyclic group in a main chain thereof. For example, the polyester resin may comprise a poly(1,4-cyclohexylene dimethylene terephthalate) (PCT) resin comprising a repeat unit represented by Formula 3:

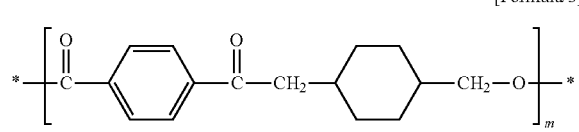

[Formula 3]

wherein m is an integer of 50 to 500 and * is a linking site.

The polyester resin may have an intrinsic viscosity [η] of about 0.4 dl/g to about 1.5 dl/g. The intrinsic viscosity may be measured at 35° C. in an o-chlorophenol solution. Within this range of viscosity, the polyester resin can improve mechanical properties and molding processability of the thermoplastic resin composition. For example, the polyester resin may have an intrinsic viscosity of about 0.6 dl/g to about 1.2 dl/g.

The polyester resin may be present in an amount of about 5 wt % to about 30 wt % based on 100 wt % of the base resin. If the content of the polyester resin is less than about 5 wt %, the thermoplastic resin composition can suffer from deterioration in plating reliability under high temperature/ humidity conditions and hydrolysis resistance, and if the content of the polyester resin exceeds about 30 wt %, the thermoplastic resin composition can suffer from deterioration in impact resistance. For example, the polyester resin may be present in an amount of about 10 wt % to about 25 wt %.

Additive for Laser Direct Structuring (LDS Additive)

The LDS additive serves to form metal nuclei upon irradiation with laser beams and may comprise any typical LDS additive used in resin compositions for LDS. Here, the term "laser beam" means light amplified through simulated emission (simulated emission light) and may be UV light having a wavelength of about 100 nm to about 400 nm, visible light having a wavelength of about 400 nm to about 800 nm, or infrared (IR) light having a wavelength of about 800 nm to about 25,000 nm, for example, IR light having a wavelength of about 1,000 nm to about 2,000 nm.

In one embodiment, the LDS additive may comprise at least one selected from the group of a heavy metal complex oxide spinel and a copper salt.

In one embodiment, the heavy metal complex oxide spinel may be represented by Formula 4:

$$AB_2O_4,$$ [Formula 4]

wherein A is a metal cation having a valence of 2, for example, magnesium, copper, cobalt, zinc, tin, iron, manganese, nickel, and a combination thereof, and B is a metal cation having a valence of 3, for example, manganese, nickel, copper, cobalt, tin, titanium, iron, aluminum, chromium, and a combination thereof.

In the heavy metal complex oxide spinel represented by Formula 4, A provides a monovalent cation component of a metal oxide cluster and B provides a monovalent cation component of a metal cation cluster. For example, the metal oxide cluster comprising A may have a tetrahedral structure and the metal oxide cluster comprising B may have an octahedral structure. Specifically, the heavy metal complex oxide spinel represented by Formula 4 may have a structure in which oxygen atoms are arranged in a cubic close-packed lattice, and B and A occupy octahedral and tetrahedral sites in the lattice, respectively.

In one embodiment, the heavy metal complex oxide spinel may include magnesium aluminum oxide ($MgAl_2O_4$), zinc aluminum oxide ($ZnAl_2O_4$), iron aluminum oxide ($FeAl_2O_4$), copper iron oxide ($CuFe_2O_4$), copper chromium oxide ($CuCr_2O_4$), manganese iron oxide ($MnFe_2O_4$), nickel iron oxide ($NiFe_2O_4$), titanium iron oxide ($TiFe_2O_4$), iron chromium oxide ($FeCr_2O_4$), magnesium chromium oxide ($MgCr_2O_4$), and combinations thereof. For example, the heavy metal complex oxide spinel may be copper chromium oxide ($CuCr_2O_4$). The copper chromium oxide ($CuCr_2O_4$) has a dark color and thus is advantageous when a final molded product is required to be black or grey.

In one embodiment, the copper salt may comprise copper hydroxide phosphate, copper phosphate, copper sulfate, cuprous thiocyanate, and combinations thereof, without being limited thereto. For example, the copper salt may be copper hydroxide phosphate. The copper hydroxide phosphate is a compound in which copper phosphate is combined with copper hydroxide, and may comprise $Cu_3(PO_4)_2 \cdot 2Cu(OH)_2$, $Cu_3(PO_4)_2 \cdot Cu(OH)_2$, and the like. The copper hydroxide phosphate does not affect color-reproduction properties of a colorant, as an additive, and thus allows a molded product having a desired color to be easily obtained.

In one embodiment, the LDS additive may have an average particle diameter of about 0.01 µm to about 50 µm, for example, about 0.1 µm to about 30 µm, specifically about 0.5 µm to about 10 µm. Within this range, it is possible to form a uniform coating surface through laser direct structuring.

As used herein, unless otherwise specifically stated, the term "average particle diameter" refers to D50 (a diameter at a distribution rate of 50%) which is a number average particle diameter.

The LDS additive may be present in an amount of about 0.1 to about 20 parts by weight relative to 100 parts by weight of the base resin. If the content of the LDS additive is less than about 0.1 parts by weight, a sufficient amount of metal nuclei is not formed in the coating during irradiation of the thermoplastic resin composition (molded product) with laser beams, thereby causing deterioration in plating adhesion, and if the content of the LDS additive exceeds about 20 parts by weight, the thermoplastic resin composition can suffer from deterioration in impact resistance and heat resistance. For example, the LDS additive may be present in an amount of about 0.1 to about 10 parts by weight. Alternatively, the LDS additive may be present in an amount of about 1 to about 8 parts by weight.

Impact Modifier

The impact modifier serves to improve durability and impact resistance of the thermoplastic resin composition. In one embodiment, the impact modifier may comprise an impact modifier of a core-shell structure obtained by grafting an unsaturated compound comprising at least one selected from the group of an acrylic monomer, an aromatic vinyl monomer, an unsaturated nitrile monomer and polymers thereof to a rubber polymer obtained through polymerization of a diene monomer or a rubber polymer obtained through copolymerization of a monomer comprising at least one monomer selected from the group of a diene monomer, an acrylic monomer, a silicone monomer, and a styrene monomer.

The diene monomer used in formation of the rubber polymer may comprise butadiene, isoprene, and the like. Specifically, butadiene may be used as the diene monomer.

The acrylic monomer used in formation of the rubber polymer may comprise alkyl (meth)acrylates, such as methyl acrylate, ethyl acrylate, n-propyl acrylate, n-butyl acrylate, 2-ethyl hexyl acrylate, hexyl methacrylate, and 2-ethyl hexyl methacrylate. Here, alkyl means $C_1$ to $C_{10}$ alkyl. Here, a crosslinking agent, such as ethylene glycol dimethacrylate, propylene glycol dimethacrylate, 1,3-butylene glycol dimethacrylate, 1,4-butylene glycol dimethacrylate, allyl methacrylate, and triallylcyanurate, may be used.

The silicone monomer used in formation of the rubber polymer may comprise linear siloxane monomers, such as dimethyl siloxane, methyl ethyl siloxane, methyl phenyl siloxane, methyl hydroxyl siloxane, methyl propyl siloxane, methyl butyl siloxane, and the like; and cyclosiloxane monomers, such as hexamethylcyclotrisiloxane, octamethylcyclotetrasiloxane, decamethylcyclopentasiloxane, dodecamethylcyclohexasiloxane, trimethyltriphenylcyclotrisiloxane, tetramethyltetraphenylcyclotetrasiloxane, octaphenylcyclotetrasiloxane, and the like. These may be used alone or as a mixture thereof. Here, a crosslinking agent, such as trimethoxymethylsilane, triethoxyphenylsilane, tetramethoxysilane, tetraethoxysilane, and the like, may be used.

The styrene monomer used in formation of the rubber polymer may comprise one selected from the group consisting of styrene, $C_1$ to $C_{10}$ alkyl substituted styrene, halogen substituted styrene, and a combination thereof.

The rubber polymer obtained through polymerization of the diene monomer may comprise polybutadiene. In addition, the rubber polymer obtained through copolymerization of the diene monomer and at least one monomer selected from the group of an acrylic monomer, a silicone monomer, and a styrene monomer may comprise a copolymer of butadiene and alkyl (meth)acrylate, a copolymer of butadiene, alkyl (meth)acrylate and cyclosiloxane, and the like. These rubber polymers may be used alone or as a mixture thereof.

In one embodiment, the rubber polymer (rubber particle) may have an average particle diameter (Z-average) of about 0.05 µm to about 6 µm. Within this range, the thermoplastic resin composition can have good impact resistance and external appearance. For example, the rubber polymer (rubber particle) may have an average particle diameter of about 0.15 µm to about 4 µm. Alternatively, the rubber polymer (rubber particle) may have an average particle diameter of about 0.25 µm to about 3.5 µm.

Among the unsaturated compounds, the acrylic monomer may comprise at least one selected from the group of alkyl (meth)acrylic acid esters and (meth)acrylic acid esters. Here, alkyl means $C_1$ to $C_{10}$ alkyl. Examples of the alkyl (meth)acrylic acid esters may comprise methyl (meth)acrylate, ethyl (meth)acrylate, propyl (meth)acrylate, butyl (meth)acrylate, and the like. For example, methyl (meth)acrylate may be used.

Among the unsaturated compounds, the aromatic vinyl monomer may comprise at least one selected from the group consisting of styrene, $C_1$ to $C_{10}$ alkyl substituted styrene, halogen substituted styrene, and a combination thereof. Examples of the alkyl substituted styrene may comprise o-ethyl styrene, m-ethyl styrene, p-ethyl styrene, and α-methyl styrene.

Among the unsaturated compounds, the unsaturated nitrile monomer may comprise at least one selected from the group consisting of acrylonitrile, methacrylonitrile, ethacrylonitrile, and a combination thereof.

The impact modifier may be present in an amount of about 1 to about 20 parts by weight relative to 100 parts by weight of the base resin. If the content of the impact modifier is less than about 1 part by weight, the thermoplastic resin composition exhibits insignificant impact reinforcement, and if the content of the impact modifier exceeds about 20 parts by weight, the thermoplastic resin composition can suffer from deterioration in heat resistance and formability. For example, the impact modifier may be present in an amount of about 0.1 to about 10 parts by weight. Alternatively, the impact modifier may be present in an amount of about 1 to about 8 parts by weight.

In one embodiment, the impact modifier and the polycarbonate-polysiloxane copolymer may be present in a weight ratio of about 1:5 to about 1:10. Within this range, the thermoplastic resin composition can exhibit good properties in terms of impact resistance, flowability and appearance. For example, the impact modifier and the polycarbonate-polysiloxane copolymer may be present in a weight ratio of about 1:5 to about 1:8.

In one embodiment, the LDS additive and the impact modifier may be present in a weight ratio of about 1:1 to about 1:3. Within this range, the thermoplastic resin composition can exhibit good appearance and plating adhesion without deterioration in impact resistance and heat resistance. For example, the LDS additive and the impact modifier may be present in a weight ratio of about 1:1 to about 1:2.

In one embodiment, the thermoplastic resin composition may be prepared in pellet form by mixing the aforementioned components, followed by melt extrusion at about 200° C. to about 300° C., for example, at about 220° C. to about 260° C. in a typical twin-screw extruder.

In one embodiment, the thermoplastic resin composition may have a notched Izod impact strength of about 50 kgf·cm/cm or more, as measured on a ⅛" thick specimen in accordance with ASTM D256. For example, the thermoplastic resin composition may have a notched Izod impact strength of about 60 to about 90 kgf·cm/cm.

In one embodiment, the thermoplastic resin composition may have about 90 grid-lattices or more remaining without being peeled off when a tape is attached to and is then detached from an injection-molded specimen having a size of 50 mm×90 mm×3.2 mm after leaving the specimen at 25° C. for 6 hours, activating a surface of the specimen in stripe form through laser direct structuring, forming a 35 μm thick copper layer on the activated surface of the specimen through plating (copper electroless plating), leaving the specimen in a chamber under conditions of 85° C. and 85% RH for 120 hours, and carving 100 grid-lattices each having a size of 1 mm×1 mm on the plating layer (copper layer). For example, the thermoplastic resin composition may have 92 to 100 grid-lattices.

In one embodiment, the thermoplastic resin composition may have a weight-dropping height of about 60 cm or more, at which cracks are generated on a specimen of the thermoplastic resin composition upon dropping a metal tip having a weight of 500 g on the specimen in accordance with the DuPont drop test method, in which the specimen is prepared by dipping an injection molded specimen having a size of 100 mm×100 mm×3.2 mm in a thinner solution (T-280, Noroo Paint®) for 2 minutes, drying the specimen at 80° C. for 20 minutes, and leaving the specimen at room temperature for 24 hours. For example, the thermoplastic resin composition may have a weight-dropping height of about 60 cm to about 130 cm.

In one embodiment, the thermoplastic resin composition may further comprise any typical additives commonly used in thermoplastic resin compositions without deteriorating the effects of the present invention, as needed. Examples of the additives may comprise lubricants, colorants, antistatic agents, and flame retardants, without being limited thereto.

The additives may be present in an amount of 0.01 parts by weight to 20 parts by weight relative to about 100 parts by weight of the base resin.

A molded product produced using the thermoplastic resin composition according to the present invention has good heat resistance and plating reliability under high temperature/humidity conditions, particularly good impact resistance after plating.

Molded Product Produced Using Thermoplastic Resin Composition for Laser Direct Structuring Another aspect of the present invention relates to a molded product formed of the thermoplastic resin composition as set forth above. For example, the molded product may be prepared by any suitable molding method, such as injection molding, dual injection molding, blow molding, extrusion molding, heat molding, and the like using the thermoplastic resin composition. The molded product can be easily formed by a person having ordinary skill in the art.

FIG. 1 is a schematic view of a molded product according to one embodiment of the present invention. It should be noted that the drawing is exaggerated in thickness of lines or size of components for descriptive convenience and clarity only. Referring to FIG. 1, a molded product 10 according to this embodiment may include a metal layer 20 formed on at least a portion of a surface thereof through LDS and plating. The molded product 10 according to the embodiment may be a circuit carrier used in manufacture of antennas. For example, the molded product 10 may be manufactured by preparing a preform 10 through injection molding using the thermoplastic resin composition and irradiating a specific region (a portion to be formed with the metal layer 20) on the surface of the preform 10 with laser beams, followed by metallization (plating) of the irradiated region to form the metal layer 20.

In one embodiment, the LDS additive included in the preform 10 is decomposed to form metal nuclei upon irradiation with laser beams. In addition, the laser beam-irradiated region has a suitable surface roughness for plating. Here, the laser beams may have a wavelength of about 248 nm, about 308 nm, about 355 nm, about 532 nm, about 1,064 nm, or about 10,600 nm.

In one embodiment, the metallization may be performed by any typical plating process. For example, the metallization may include dipping the laser beam-irradiated preform 10 in at least one electroless plating bath to form the metal layer 20 (electrically conductive path) on the laser beam-irradiated region of the surface of the preform 10. Here, examples of electroless plating may include copper plating, gold plating, nickel plating, silver plating, zinc plating, and tin plating.

The molded product having the metal layer formed on at least a portion of the surface thereof by LDS can be easily manufactured by those skilled in the art.

Mode for Invention

Next, the present invention will be described in more detail with reference to some examples. It should be understood that these examples are provided for illustration only and are not to be construed in any way as limiting the present invention.

EXAMPLES AND COMPARATIVE EXAMPLES

Details of components used in Examples and Comparative Examples are as follows.

(A) Base resin (A1) Polycarbonate resin: L-1225WX (Teijin Limited).

(A2) Polycarbonate-polysiloxane copolymer: FG1700 (Idemitsu-Kosan Co., Ltd.).

(A3) Polyester resin: SkyPURA 0502 (poly(1,4-cyclohexylene dimethylene terephthalate) (PCT) resin, intrinsic viscosity: 0.75 dl/g, SK Chemicals Co., Ltd.)

(A4) Polyester resin: DHK 011 (polybutylene terephthalate (PBT) resin, intrinsic viscosity: 1.20 dl/g, Shinkong Co., Ltd.).

(B) LDS additive: Iriotec® 884X series (copper hydroxide phosphate, Merck Performance Materials Co., Ltd.).

(C) Impact modifier: Metablen S-2100 (impact modifier of a core-shell structure obtained by grafting methyl methacrylate to a copolymer rubber core of an acrylic monomer and a silicone monomer, Mitsubishi Rayon Co., Ltd.).

Examples 1 and 2 and Comparative Examples 1 to 15

The aforementioned components were weighed in amounts as listed in Tables 1 and 2 and subjected to extrusion in a twin-screw extruder (L/D=36, Φ: 45 mm) at a barrel temperature of 250° C. under conditions of a screw rotational speed of 250 rpm and a total ejection rate of 60 kg/h, thereby preparing thermoplastic resin compositions in pellet form. The prepared pellets were dried at 100° C. for 4 hours and subjected to injection molding using a 10 oz injection molding machine at an injection temperature of 300° C., thereby preparing specimens. The prepared specimens were evaluated as to the following properties by the following methods, and evaluation results are shown in Tables 1 to 2.

Property Evaluation (1) Impact resistance (kgf·cm/cm): Izod impact strength was measured on a ⅛" thick notched Izod specimen in accordance with ASTM D256.

(2) Plating reliability: An injection-molded specimen having a size of 50 mm×90 mm×3.2 mm was left at 25° C. for 6 hours, followed by activating a surface of the specimen in stripe form through laser direct structuring. Then, a 35 μm thick copper layer was formed on the activated surface of the specimen through plating (copper electroless plating) and left in a chamber under conditions of 85° C. and 85% RH for 120 hours, followed by carving 100 grid-lattices each having a size of 1 mm×1 mm on the plating layer (copper layer). Then, a tape was attached to the plating layer and plating reliability was evaluated based on the number of grid-lattices remaining on the plating layer upon detachment of the tape from the plating layer. Upon detachment of the tape from the plating layer, 90 or more grid lattices remaining on the plating layer was rated as "good" and less than 90 grid lattices remaining on the plating layer was rated as "poor".

(3) Plane impact resistance after plating (cm): An injection molded specimen having a size of 100 mm×100 mm×3.2 mm was dipped in a thinner solution (T-280, Noroo Paint®) for 2 minutes, dried at 80° C. for 20 minutes, and left at room temperature for 24 hours, followed by measuring a weight-dropping height, at which cracks were generated on the specimen upon dropping a metal tip having a weight of 500 g on the specimen in accordance with the DuPont drop test method.

TABLE 1

| | | Example | | Comparative Example | | | | | |
|---|---|---|---|---|---|---|---|---|---|
| | | 1 | 2 | 1 | 2 | 3 | 4 | 5 | 6 |
| (A) (wt %) | (A1) | 60 | 40 | 70 | 80 | 100 | 60 | 70 | 95 |
| | (A2) | 20 | 40 | — | — | — | — | — | — |
| | (A3) | 20 | 20 | 30 | 20 | — | 40 | 30 | 5 |
| (B) (parts by weight) | | 4 | 4 | 4 | 4 | 4 | 4 | 4 | 4 |
| (C) (parts by weight) | | 4 | 4 | 4 | 4 | 4 | 4 | — | 4 |
| Impact strength | | 70 | 70 | 50 | 56 | 70 | 10 | 8 | 70 |
| Plating reliability | | Good | Good | Good | Good | Good | Good | Good | Good |
| Plane impact resistance after plating | | 82 | 110 | 22 | 33 | 50 | Less than 10 | Less than 10 | 50 |

TABLE 2

| | | Comparative Example | | | | | | | | |
|---|---|---|---|---|---|---|---|---|---|---|
| | | 7 | 8 | 9 | 11 | 12 | 13 | 14 | 15 | 16 |
| (A) (wt %) | (A1) | 60 | 80 | 18 | 75 | 65 | 22 | 65 | 40 | 60 |
| | (A2) | 20 | — | 42 | 15 | 5 | 73 | 32 | 15 | 20 |
| | (A3) | 20 | 20 | 40 | 10 | 30 | 5 | 3 | 45 | — |
| | (A4) | — | — | — | — | — | — | — | — | 20 |
| (B) (parts by weight) | | 22 | — | 4 | 4 | 4 | 4 | 4 | 4 | 4 |
| (C) (parts by weight) | | — | 25 | 4 | 4 | 4 | 4 | 4 | 4 | 4 |
| Impact strength | | 8 | 50 | 10 | 62 | 50 | 70 | 70 | 10 | 20 |
| Plating reliability | | Poor | Poor | Good | Poor | Good | Poor | Poor | Good | Good |
| Plane impact resistance after plating | | Less than 10 | 110 | 15 | 32 | 25 | 110 | 85 | Less than 10 | Less than 10 |

As shown in Table 1, it could be seen that the thermoplastic resin compositions according to the present invention had good properties in terms of impact resistance, plating reliability under high temperature/humidity conditions, and surface impact strength after plating.

It could be seen that the thermoplastic resin compositions of Comparative Examples 1, 2, 4 and 6 prepared without using the polycarbonate-polysiloxane copolymer had lower impact strength and lower surface impact strength after plating than those of Examples 1 and 2; the thermoplastic resin composition of Comparative Example 3 prepared without using the polycarbonate-polysiloxane copolymer and the polyester resin had lower impact strength after plating than those of Examples 1 and 2; and the thermoplastic resin composition of Comparative Example 5 prepared without using the polycarbonate-polysiloxane copolymer and the impact modifier had much lower impact strength and surface impact strength after plating than those of Examples 1 and 2.

In addition, it could be seen that the thermoplastic resin composition of Comparative Example 7 prepared using an excess of the LDS additive and the thermoplastic resin composition of Comparative Example 8 prepared using an excess of the impact modifier suffered from deterioration in plating reliability, as compared with Examples 1 and 2. Further, it could be seen that the thermoplastic resin compositions of Comparative Examples 9 to 14 prepared using the polycarbonate resin, the polycarbonate-polysiloxane copolymer or the polyester resin of the base resin not within the inventive range of the present invention suffered from deterioration in balance between plating reliability and impact resistance; and the thermoplastic resin composition of Comparative Example 15 prepared using a different kind of polyester resin than that of the present invention suffered from deterioration in plane impact strength after plating.

It should be understood that various modifications, changes, alterations, and equivalent embodiments can be made by those skilled in the art without departing from the spirit and scope of the present invention.

The invention claimed is:

1. A thermoplastic resin composition comprising:
   100 parts by weight of a base resin comprising about 20 wt % to about 70 wt % of a polycarbonate resin, about 10 wt % to about 70 wt % of a polycarbonate-polysiloxane copolymer, and about 5 wt % to about 30 wt % of a polyester resin containing an alicyclic group in a main chain, wherein the polyester resin comprises poly(1,4-cyclohexylene dimethylene terephthalate) (PCT);
   about 0.1 to about 20 parts by weight of an additive for laser direct structuring; and
   about 1 to about 20 parts by weight of an impact modifier,
   wherein the impact modifier and the polycarbonate-polysiloxane copolymer are present in a weight ratio of about 1:5 to about 1:10, and
   wherein the thermoplastic resin composition has a weight-dropping height of about 60 cm or more, at which cracks are generated on a specimen of the thermoplastic resin composition upon dropping a metal tip having a weight of 500 g on the specimen in accordance with a DuPont drop test method, the specimen being prepared by dipping an injection molded specimen having a size of 100 mm×100 mm×3.2 mm in a thinner solution for 2 minutes, drying the specimen at 80° C. for 20 minutes, and leaving the specimen at room temperature for 24 hours, and
   wherein the composition exhibits plating reliability measured by injection molding the composition to form a specimen having a size of 50 mm×90 mm×3.2 mm, activating a surface of the specimen in stripe form through laser direct structuring, forming a 35 μm thick copper layer on the activated surface of the specimen through copper electroless plating, leaving the plated specimen in a chamber under conditions of 85° C. and 85% RH for 120 hours, carving 100 grid-lattices each having a size of 1 mm×1 mm on the copper plating layer, attaching a tape to the plating layer, and detaching the tape from the plating layer to evaluate plating reliability based on the number of grid-lattices remaining on the plating layer upon detachment of the tape from the plating layer, wherein upon detachment of the tape from the plating layer, 90 or more grid lattices remain on the plating layer.

2. The thermoplastic resin composition according to claim 1, wherein the polycarbonate-polysiloxane copolymer comprises about 80 wt % to about 95 wt % of a polycarbonate block and about 5 wt % to about 20 wt % of a polysiloxane block.

3. The thermoplastic resin composition according to claim 1, wherein the polycarbonate-polysiloxane copolymer has a weight average molecular weight of about 10,000 g/mol to about 50,000 g/mol.

4. The thermoplastic resin composition according to claim 1, wherein the additive for laser direct structuring comprises a heavy metal oxide complex spinel and/or a copper salt.

5. The thermoplastic resin composition according to claim 1, wherein the impact modifier comprises an impact modifier having a core-shell structure obtained by grafting an acrylic monomer, an aromatic vinyl monomer, an unsaturated nitrile monomer, and/or a polymer of an acrylic monomer, an aromatic vinyl monomer, and/or an unsaturated nitrile monomer to a rubber polymer obtained through polymerization of a diene monomer or a rubber polymer obtained through copolymerization of a diene monomer with another monomer comprising an acrylic monomer, a silicone monomer, and/or a styrene monomer.

6. The thermoplastic resin composition according to claim 1, wherein the additive for laser direct structuring and the impact modifier are present in a weight ratio of about 1:1 to about 1:3.

7. A molded product formed of the thermoplastic resin composition according to claim 1.

8. The molded product according to claim 7, wherein the molded product comprises a metal layer formed on at least part of a surface thereof by laser direct structuring and plating.

* * * * *